(12) United States Patent
Vanier et al.

(10) Patent No.: US 6,255,647 B1
(45) Date of Patent: Jul. 3, 2001

(54) ATOMIC FREQUENCY STANDARD BASED ON COHERENT STATE PREPARATION

(75) Inventors: Jacques Vanier, Notre Dame de l'Ile Perrot (CA); Martin W. Levine, Manchester, MA (US)

(73) Assignee: Kernco, Inc., Danvers, MA (US)

( * ) Notice: Subject to any disclaimer, the term of this patent is extended or adjusted under 35 U.S.C. 154(b) by 0 days.

(21) Appl. No.: 09/265,351
(22) Filed: Mar. 9, 1999
(51) Int. Cl.[7] .............. H03L 7/26; H03B 17/00; H01S 1/06
(52) U.S. Cl. .............. 250/251; 331/3; 331/94.1
(58) Field of Search .............. 250/251; 331/3, 331/94.1

(56) References Cited

U.S. PATENT DOCUMENTS

| | | | |
|---|---|---|---|
| 4,454,482 | * | 6/1984 | DeMarchi .............. 250/251 |
| 5,107,226 | * | 4/1992 | Pascaru .............. 331/3 |
| 5,387,881 | * | 2/1995 | Schweda et al. .............. 331/94.1 |
| 5,657,340 | * | 8/1997 | Camparo et al. .............. 250/251 |

OTHER PUBLICATIONS

Vanier, Jacques, The Physical Review, vol. 168, No. 1, Apr. 1968, pp. 129–149.*
Goldenberg et al., Physical Review, vol. 123, No. 2, Jul. 15, 1961, pp. 530–537.*
Shimoda et al., Physical Review, vol. 102, No. 5, Jun. 1, 1956, pp. 1308–1321.*

* cited by examiner

Primary Examiner—Jack Berman
(74) Attorney, Agent, or Firm—Barry R. Blaker

(57) ABSTRACT

An atomic frequency standard based on coherent microwave emission from an ensemble of hydrogen or alkali metal atoms at their ground state hyperfine frequency. Hydrogen or alkali metal atoms are prepared in a coherent state by means of a radiation field resonant with the atoms at their hyperfine frequency prior to their entering into the emission region. The coherent microwave radiation emission results from the phenomenon of stimulated emission of radiation in a storage bulb placed in a cavity tuned to the hyperfine frequency. Because the atoms enter the cavity already prepared in a coherent state, radiation is emitted without threshold regarding the atomic flux or the cavity quality factor. The atoms emit their energy at their natural frequency perturbed only slightly by secondary effects such as spin exchange collisions, wall collisions and second order cavity pulling.

31 Claims, 6 Drawing Sheets though the lifetime of the coherent state is reduced slightly by such collisions, the mixed state is maintained for a relatively long time. The atomic beam traverses the microwave field region and enters the storage bulb where it continues to maintain the coherent state for a duration of the order of one second. This is sufficient time for the atoms to interact with the surrounding microwave cavity and radiate their energy into it through stimulated emission. The process of radiation is maintained continuously and the cavity is excited at the atomic hyperfine frequency.

ATOMIC FREQUENCY STANDARD BASED ON COHERENT STATE PREPARATION

BACKGROUND OF THE INVENTION

1. Field of the Invention

The present invention relates broadly to the field of atomic frequency standards. In particular it relates to the class of so-called active atomic frequency standards in which coherent microwave energy is radiated by an ensemble of atoms in a cavity. In a broad sense, the system is a maser [1], [2] wherein monochromatic microwave radiation is generated by stimulated emission. More particularly the system uses the property of atoms to emit coherent microwave radiation when placed in a coherent superposition of states [3].

2. Description of the Prior Art

In some frequency standards, like the hydrogen maser [2], a beam of atoms is directed towards a storage bulb placed in a microwave cavity. Only those atoms in the upper ground state hyperfine levels F=1, $m_F$=0 and 1 (see FIG. 1) are allowed to enter the storage bulb. This is done in the following way. First a narrow beam of atomic hydrogen is formed. The atomic beam is obtained through dissociation of molecular hydrogen in a small glass bulb by means of a radio frequency discharge at about 100 MHz. The power involved is a few watts. The atomic beam is collimated at the exit of the dissociator bulb and the atoms pass through a strong inhomogeneous-axially-symmetrical field created by a hexapole magnet. The field is zero on the beam axis and very strong at the tips of the magnet poles. Due to the properties of the atom-field interaction, those atoms in the upper energy levels F=1, $m_F$=0 and 1 are forced towards the beam and field axis. The process results in a focusing of the atomic beam on the entrance hole of the storage bulb. They enter the said storage bulb. Only those atoms in the level F=1, $m_F$=0 are of interest due to the fact that their energy depends on the ambient field in second order only, while the energy of the atoms in level F=1, $m_F$=1 depends linearly on the ambient magnetic field. The storage bulb is coated internally with polytetrafluoroethylene (PTFE) or another substance such as dimethyldichlorosilane or a paraffin, that reduces considerably the relaxation of the atoms upon collision with the storage bulb inner surface. Storage times of the order of one second are possible with a bulb having a diameter of the order of 15 cm. The atoms make random transits of the bulb and interact with the electromagnetic field of the surrounding microwave cavity. When a sufficient number of atoms enter the storage bulb and when the quality factor Q of the cavity is sufficiently large, the atoms radiate their energy into the microwave cavity oscillation takes place at the ground state hyperfine frequency through stimulated emission. Atoms in the level F=1, $m_F$=0 fall to the lower level F=0, $m_F$=0 emitting their energy corresponding to a frequency of 1420 MHz. If the beam is maintained continuously the population of the upper level F=1, $m_F$=0 is replenished and microwave energy is emitted on a continuous basis at a power level of the order of $10^{-13}$ W.

Continuous oscillation is possible only if hydrogen atoms enter the storage bulb at a sufficient rate and the cavity Q is sufficiently large. These criteria set a threshold on the continuous oscillation condition and put rather stringent limits on the design of the system. As a consequence the cavity design is limited to specific modes which provide a sufficiently high Q. This limits the possibility of reducing the size of the system. Furthermore, the operation of the system depends on the high efficiency of the molecular hydrogen dissociator. Maser oscillators have been operated successfully for relatively long periods and offer at present the best medium and short-term frequency stability of all the atomic frequency standards. However, the oscillation threshold has always been an important factor and has affected the size and weight of the resulting system, due mainly to the high quality factor, Q, required for the cavity. In such an oscillating maser, the cavity tuning influences in first order the frequency of emission.

The invention described in the present document bypasses the threshold conditions encountered in the prior art by preparing the atoms in a coherent superposition of energy states before they enter the storage bulb. The case of the hydrogen maser is used as an example. The hydrogen atomic beam is forced to pass in a small region where a microwave field at the hyperfine frequency of the atoms is present. When the amplitude and the frequency of the field are adjusted to the appropriate value, the atoms are put in a coherent mixed state of the two levels F=1, $m_F$=0 and F=0, $m_F$=0. The lifetime of this coherent state in free space is relatively very long and the atoms enter the storage bulb in that coherent state. Collision with the inner surface of the storage bulb only slightly perturb the atoms and the coherent state relaxation rate due to collisions with the PTFE or other appropriate surface coatings is of the order of one second. The hyperfine coherence present in the ground state in the storage bulb creates a magnetization in the storage bulb oscillating at the hyperfine frequency. This magnetization excites a field mode in the cavity. This field reacts back on the atoms and excites them to emit quanta of energy through stimulated emission. If the magnetization is replenished by means of a continuous beam, the ensemble emits coherent microwave energy. This emission of energy takes place without threshold in relation to the number of atoms in the storage bulb or to the quality factor, Q, of the cavity. Furthermore the cavity tuning influences the emission frequency primarily only in second order.

It is a principal object of this invention to provide a novel atomic frequency standard of the maser type wherein the atoms are prepared in a coherent state before they enter the region of emission, the microwave cavity-storage bulb assembly.

It is another object of the present invention to provide a novel atomic frequency standard of the maser type of smaller volume and weight than previously realized.

Another object of the invention is to provide an atomic frequency standard of the maser type possessing substantially improved latitude in the choice of the storage bulb shape and size.

It is still another object of the present invention to provide an atomic frequency standard having greater liberty in the choice of the microwave cavity mode, making possible, through a judicious choice of that mode or by loading the cavity with a dielectric material, a large reduction in volume and weight relative to the prior art.

It is also an object of this invention to provide an active atomic frequency standard of the maser type which emits a signal at a frequency that is dependent on the microwave cavity tuning primarily in a second order.

It is another object of the invention to provide a novel method for the generation of a coherent monochromatic microwave signal by stimulated emission in an atomic ensemble through the use of coherent state preparation.

Other objects and advantages of the present invention will, in part, be obvious and will, in part, appear hereinafter.

SUMMARY OF THE INVENTION

In accordance with the invention, a coherent monochromatic microwave signal, amplified by stimulated emission, is generated by: a) providing an atomic source material, b) inverting the population of the ground state hyperfine energy levels of said material, and c) pre-stimulating said population inverted material into a coherent superposition of the ground state energy levels thereof preparatory to its entry into a maser microwave cavity tuned to the hyperfine resonance frequency of the source material atoms and wherein, by interaction of said material atoms with the electromagnetic field of the cavity, microwave amplification by stimulated emission of radiation takes place and a microwave frequency standard signal ensues. By "coherent superposition of the ground state hyperfine energy levels" it is meant a quantum mechanical state in which the phases of the individual atoms of the said atomic source material, represented by quantum mechanical waves, are coherent, which causes the said atomic source material to act as a single entity, possessing a single well defined phase and a macroscopic magnetic moment oscillating at the ground state hyperfine frequency. The atomic frequency standard of the invention broadly comprises means to excite an atomic source material, into an inversion of its ground state hyperfine energy levels, means to pre-stimulate the excited source material into a coherent superposition of its ground state hyperfine energy levels and maser means comprising a microwave cavity containing a storage bulb therewithin, said storage bulb receiving the pre-stimulated atoms therewithin and said microwave cavity being tuned to the resonance hyperfine frequency of the atomic source material. Herein there are disclosed three preferred embodiments of the apparatus of the invention.

The first type (illustrated in FIGS. 2 and 2A) comprises of an atomic hydrogen beam system, including a molecular hydrogen dissociator and hexapole (or quadrupole) magnet focusing a certain population of the atoms as a beam on the entrance of a storage bulb. This storage bulb is situated in a microwave cavity whose mode is chosen in relation to the weak applied magnetic field such as to allow only so-called field independent transitions in the atomic ensemble. Prior to entering the storage bulb the hydrogen atomic beam is submitted to an oscillating magnetic field at the frequency of the hyperfine transition over a small region of its trajectory. This places the atoms in a coherent state which is a superposed mixture of the two hyperfine ground state levels F=1, $m_F$=0 and F=0, $m_F$=0. This is a radiant state and when these atoms enter the cavity they emit their energy into the cavity mode which reacts back on the atoms to establish and maintain stimulated emission.

The second type (illustrated in FIGS. 3 and 3A) is an embodiment using alkali metal atoms in an arrangement consisting of a pumping cell and storage bulb connected by means of a drift tube. The population of the ground state hyperfine energy levels are inverted by means of laser radiation into the pumping cell. The atoms are allowed to diffuse into a drift region where they are placed into a coherent superposition of their hyperfine ground state energy levels by means of a microwave field. The atoms then drift inside a storage bulb situated within a maser microwave cavity where they emit their energy in a process similar to that described above in the case of the embodiment using hydrogen.

The third type (illustrated in FIGS. 4 and 4A) is an embodiment using alkali metal atoms prepared into a coherent superposition of their hyperfine ground state energy levels by the technique of Coherent Population Trapping (CPT). The arrangement is similar to that of the second embodiment, above, having a pumping cell and a storage bulb communicating by means of a drift region. However, in this embodiment, inversion and pre-stimulation is done directly by the CPT technique in the pumping cell and there is no separate and distinct pre-stimulation by a microwave field in the drift region as in the embodiment of FIGS. 3 and 3A.

In the broad sense, the invention relates to the practical use of the preparation of an ensemble of atoms into a coherent superposition of their hyperfine ground state energy levels before they enter the region where this ensemble emits its energy. The resulting frequency standards do not have a threshold of oscillation. These standards may be said to be hybrid systems that belong to the class of active masers since they emit energy by means of stimulated emission of radiation, and to the class of passive devices since they do not have an oscillation threshold.

DESCRIPTION OF THE PREFERRED EMBODIMENTS

This invention relates to the realization of an atomic frequency standard based on the principle of the preparation of an ensemble of atoms into a coherent superposition of their hyperfine ground state energy levels, or what is called in the present description "pre-stimulation", before they enter the region where they emit their energy under stimulated emission as in a maser. The basic concept consists in the preparation of the atoms in such a coherent state that these atoms act as an ensemble characterized by an internal oscillating magnetization, which radiates energy at the hyperfine frequency of the ground state of these atoms. This pre-stimulation is accomplished outside the microwave radiating region, thereby avoiding any perturbation of the atomic ensemble by the agent or means used to produce the coherence. The microwave radiating region is defined by a low dielectric loss storage bulb placed inside a microwave cavity resonant at the hyperfine frequency of the said atoms. The cavity has two roles: 1) it acts as a collector of the radiation emitted by the atoms; 2) it creates a field which stimulates the atoms to emit their energy at a greater rate as in a maser.

Figure 1:
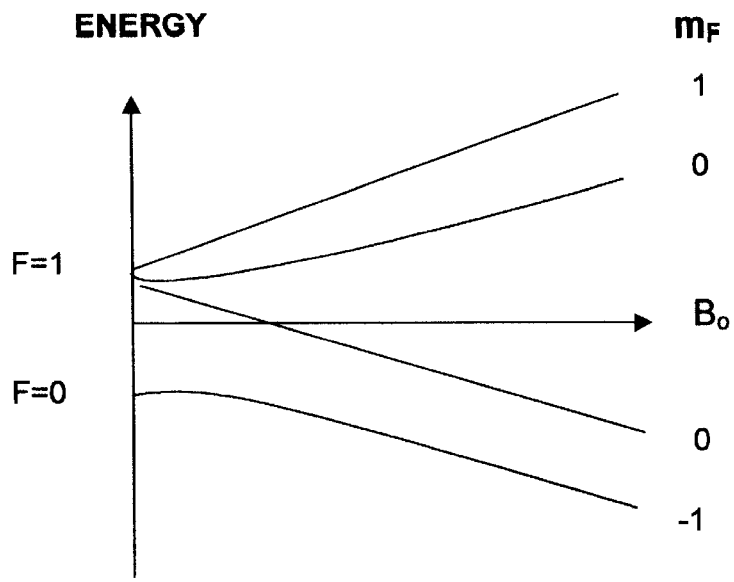
FIG. 1 is an illustration of the lower state energy levels of the hydrogen atom.
Figure 2:
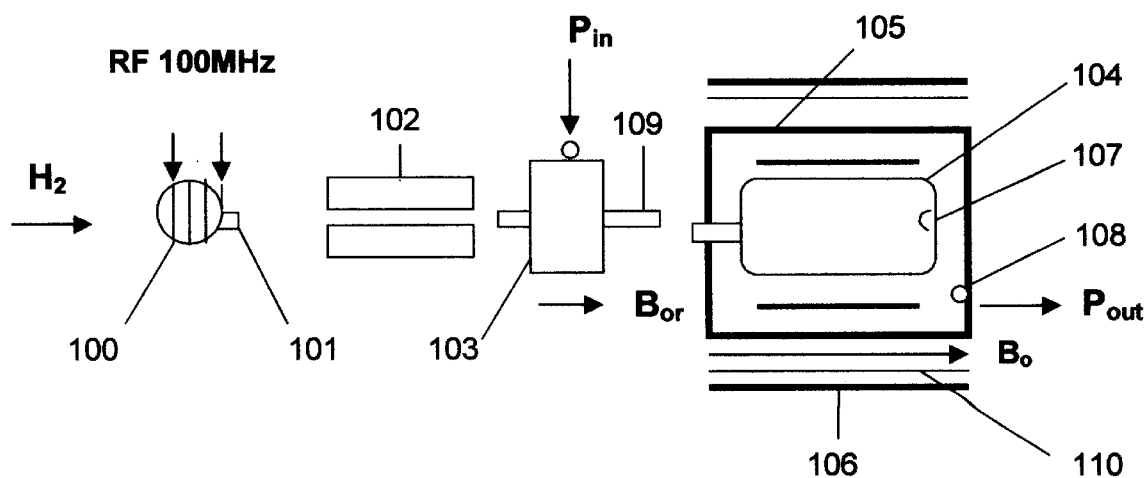
FIG. 2 is a schematic illustration of one embodiment of an atomic frequency standard of the invention in the nature of a hydrogen maser using coherent state preparation of the atoms before they enter the storage-bulb-cavity assembly.
Figure 2A:
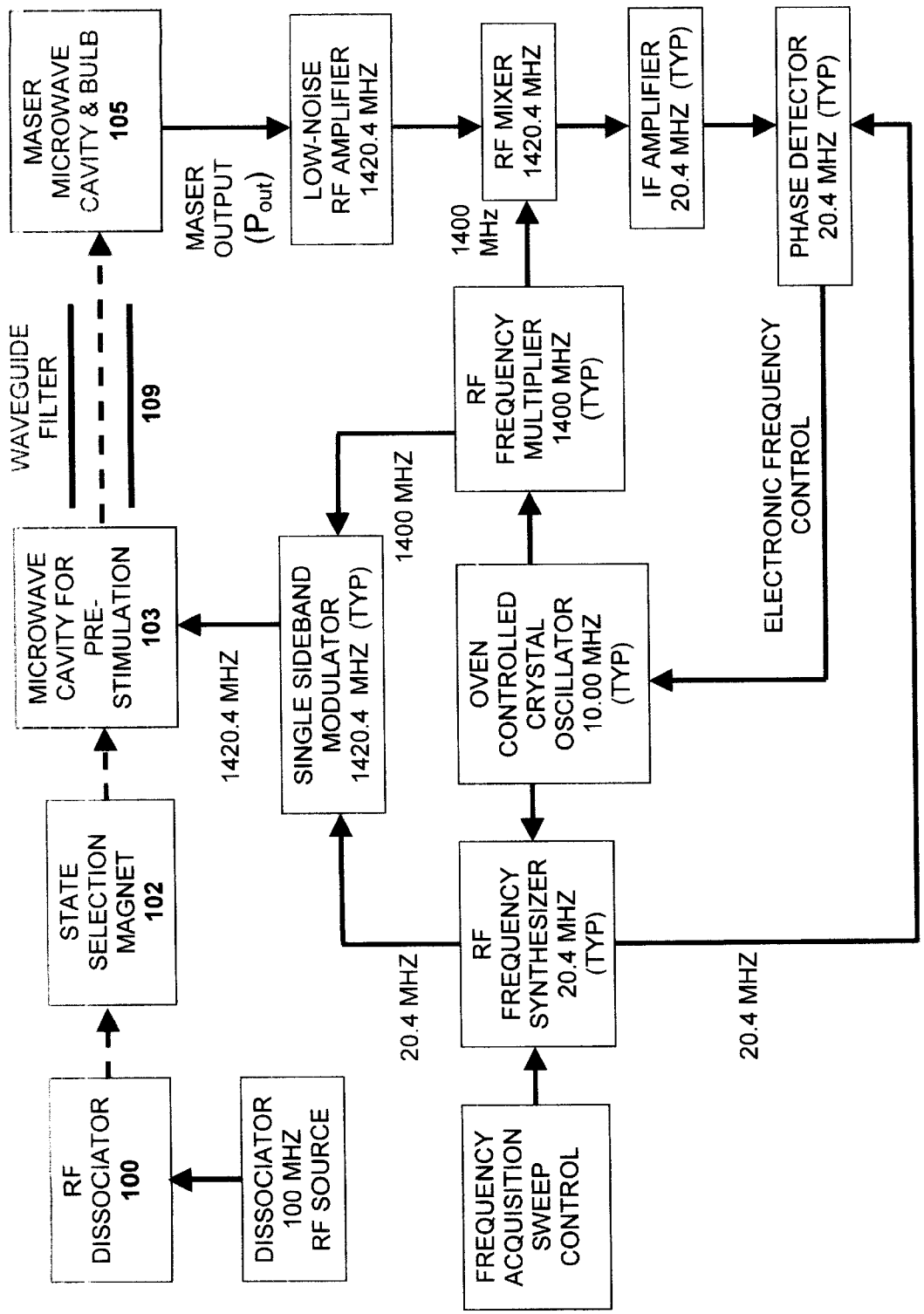
FIG. 2A is a schematic electronics block diagram for the hydrogen frequency standard of FIG. 2.

The schematic arrangement of FIGS. 2 and 2A shows an embodiment of the invention in the nature of a hydrogen maser. Molecular hydrogen is fed to a radio frequency hydrogen dissociator 100 which subjects the hydrogen molecules to a radio frequency of about 100 MHz, thereby dissociating the molecules. An atomic beam is formed with a collimator 101 at the exit of the dissociator 100. This beam passes through a state selector such as, but not limited to, a hexapole magnet 102, which causes inversion of the population of the ground state hyperfine energy levels by spatial selection. Thus, atoms in the states F=1, $m_F$=1 and F=1, $m_F$=0 and concentrated by the magnetic field on the beam axis, whereas those atoms in the energy state levels F=1, $m_F$=−1 and F=0, $m_F$=0 are deviated away from the beam axis. The beam passes through a microwave structure 103 driven by an external source having a frequency equal to the hyperfine frequency that exposes the atoms to radiation at the hyperfine frequency of the said atoms which, in the case of hydrogen, is about 1420 MHz. In passing through microwave structure 103 those atoms in state F=1, $m_F$=0 are excited into a coherent state that is a superposed mixture of the two states F=1, $m_F$=0 and F=0, $m_F$=1 with the atoms having equal probability of being in either of these states. A magnetic field $B_{or}$ provides a quantization axis for defining these states. This coherent state is characterized by a relatively long lifetime and the atomic ensemble emits energy in free space at a relatively low rate. These atoms then pass through cut off wave guide 109 which retains microwave energy within structure 103 and enter the storage bulb 104 within the maser microwave cavity 105 wherein their energy is emitted at a faster rate. As is known in the art the microwave cavity 105 is tuned to the hyperfine resonance frequency of hydrogen and is surrounded by a magnetic shield 106. The atomic ensemble creates in the cavity 105 a magnetization oscillating at the ground state hyperfine frequency of the hydrogen atoms. This magnetization excites one of the cavity modes and a field is created which stimulates emission of additional quanta of energy from the atoms. The system thus acts as an amplifier of microwave radiation, the atomic magnetization acting as the source of energy. The microwave radiation acts as the intermediate agent coupling the cavity 105 to the atomic ensemble. The cavity 105 is surrounded by a magnetic shield 106 providing a region where environmental magnetic field fluctuations are greatly attenuated. A weak homogeneous magnetic field is created in the cavity 105 region by means of a solenoid 110 to provide a quantization axis for the atomic ensemble. Unlike hydrogen maser frequency standards of the prior art, the stimulated emission in the microwave cavity 105 of the system of the present invention occurs without threshold regarding cavity Q and atomic flux. The power output of the system is a function of the number of atoms in the storage bulb 104 and the quality factor of the cavity. It is noted that the coherence relaxation lifetime due to collisions with the storage bulb walls, which preferably comprise a PTFE coating 107, is of the order of one second. This is sufficiently long for the energy to be emitted by the said atoms before they lose coherence through collisions with the wall. The resulting microwave energy frequency signal, $P_{out}$, is detected at the cavity-coupling loop 108.

The schematic arrangements of FIGS. 3, 3A, 4, and FIGS. 4A, respectively, depict different embodiments using the concept of the invention of pre-stimulation but which are more suitable for use with alkali metal atoms as the atomic source material. In the case of alkali metal atoms such as rubidium and cesium the elements exist naturally as atomic species and no dissociation of molecules is required as for hydrogen. Furthermore, it is possible to prepare it the coherent state of the ensemble by means of optical pumping techniques using solid state diode lasers.

For the purposes of the following illustrative discussion of the embodiments of FIGS. 3, 3A, 4 and 4A rubidium 87 will be employed as the exemplary atomic source material. It will be recognized, of course, that by suitable modifications known to those of skill in the art these embodiments can also utilize other alkali metal atomic source materials, such as cesium.

Figure 5:
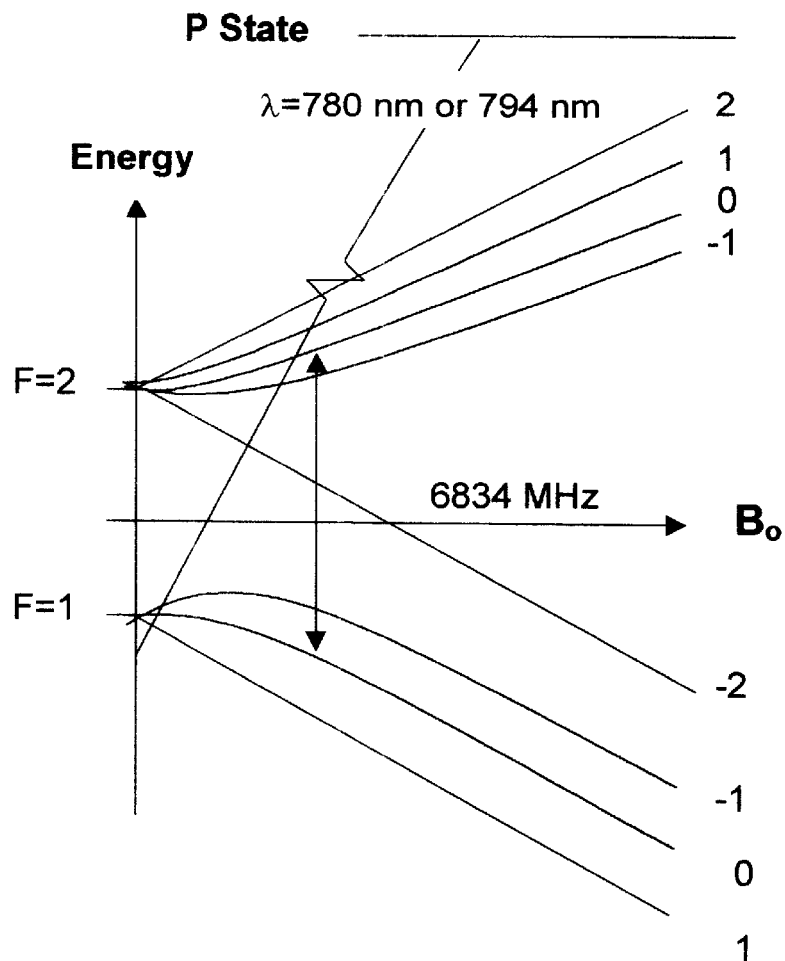
FIG. 5 is an illustration of the lower energy levels of rubidium 87 including the first excited P state used both in the intensity optical pumping method depicted in FIGS. 3, 3A and in the Coherent Population Trapping method depicted in FIGS. 4, 4A.

Referring first to FIG. 5, it will be noted that the ground state of rubidium 87 has an energy level structure similar to that of hydrogen but with the two hyperfine levels separated by 6834 MHz and having quantum numbers F=1 and F=2.

Figure 3:
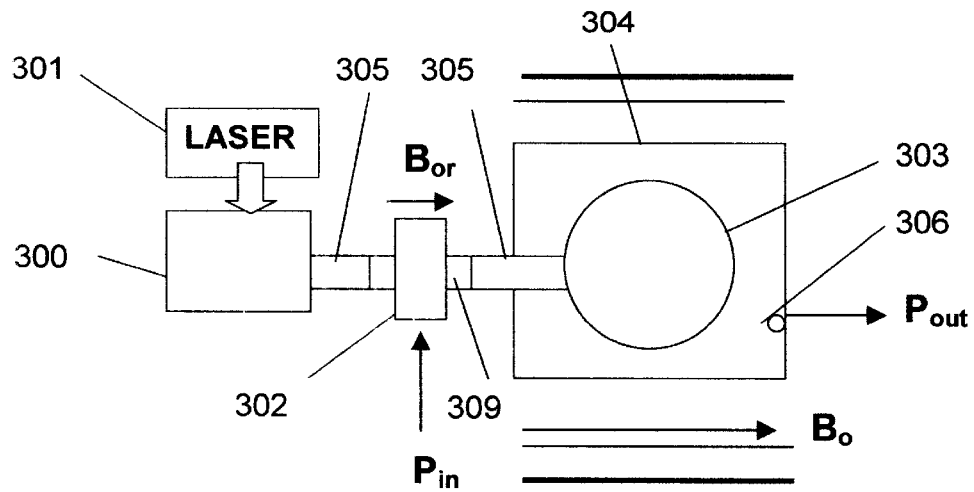
FIG. 3 is a schematic illustration of another embodiment of the atomic frequency standard of the invention emitting coherent microwave radiation using intensity optical pumping and microwave pre-stimulation of an alkali metal source material such as rubidium or cesium to implement a maser frequency standard oscillating under stimulated emission without an atomic threshold.
Figure 3A:
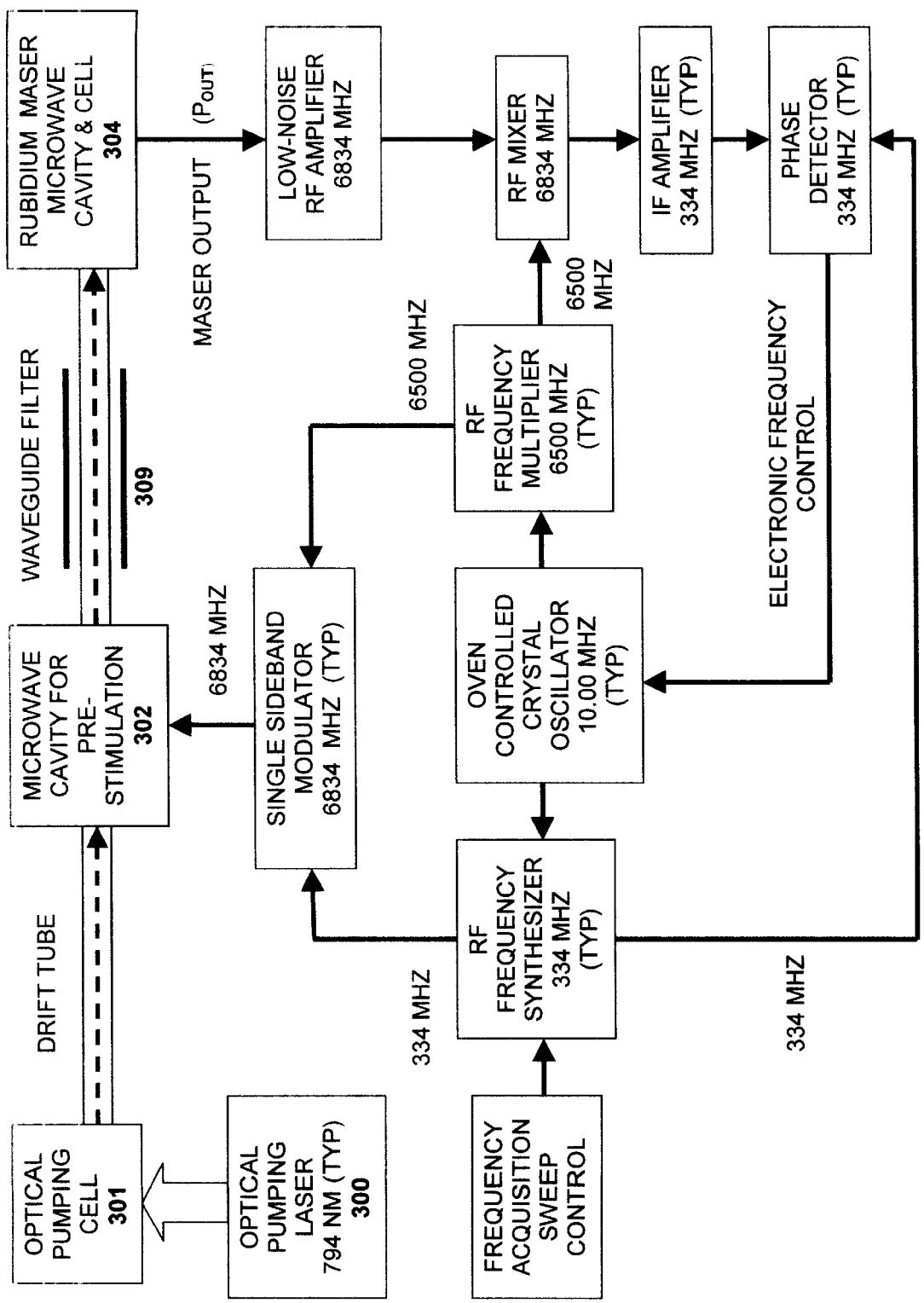
FIG. 3A is a schematic electronic block diagram for the frequency standard of FIG. 3, utilizing rubidium 87 as the exemplary atomic source material.

Referring now to FIGS. 3 and 3A, the population of the rubidium 87 atomic ensemble is prepared in a pumping cell 300 by intensity optical pumping of this atomic source material utilizing a laser 301. The rubidium 87 atoms are optically pumped from level F=1 to the excited state P as illustrated in FIG. 5. The excited P state atoms fall back equally by spontaneous emission to levels F=1 and F=2, but since pumping is done continuously from level F=1, essentially all atoms end up in level F=2. The atomic populations are thus out of thermal equilibrium and are said to be inverted. The pumping cell 300 is connected to a microwave pre-stimulating cavity 302 and thence to the storage bulb 303 of maser microwave cavity 104 by drift region 305. The microwave pre-stimulation cavity 302 is equipped with a cut-off waveguide 309 which, as in the embodiment of FIGS. 2, 2A, serves to contain the microwave radiation within cavity 302. The internal surfaces of the pumping cell 300, drift region 305, pre-stimulating cavity 302 and storage bulb 303 are coated with a substance, such as paraffin, to mitigate against relaxation when the alkali metal atoms collide with said inner surfaces.

In steady state, the atoms drift between the pumping cell 300 and the storage bulb 303 of the maser microwave cavity 304 through the drift region 305. Thus, the atoms, while in transit from the cell 300 to bulb 303, pass through the pre-stimulating microwave cavity 302 driven by an external source having a frequency equal to the hyperfine frequency wherein they are exposed to a microwave field whose frequency is resonant with the hyperfine frequency of the atoms in question. In the case of rubidium 87 this resonant field frequency is 6834 MHz. The rubidium atoms are thereby excited into a coherent superposition of the two hyperfine ground state energy levels F=2, $m_F$=0 and F=1, $m_F$=0. A magnetic field $B_{or}$ provides a quantization axis for defining these states. The pre-stimulated atoms then pass into the storage bulb 303 of the maser microwave cavity 304 wherein they create a magnetization oscillating at the resonance hyperfine frequency of the rubidium 87 atoms. As in the case of the embodiment of FIGS. 2, 2A using hydrogen as the atomic source material, this magnetization creates a field in the cavity 304 and microwave amplification by stimulated emission follows. The emitted microwave frequency signal, $P_{out}$, is detected at the cavity-coupling loop 306.

Figure 4:
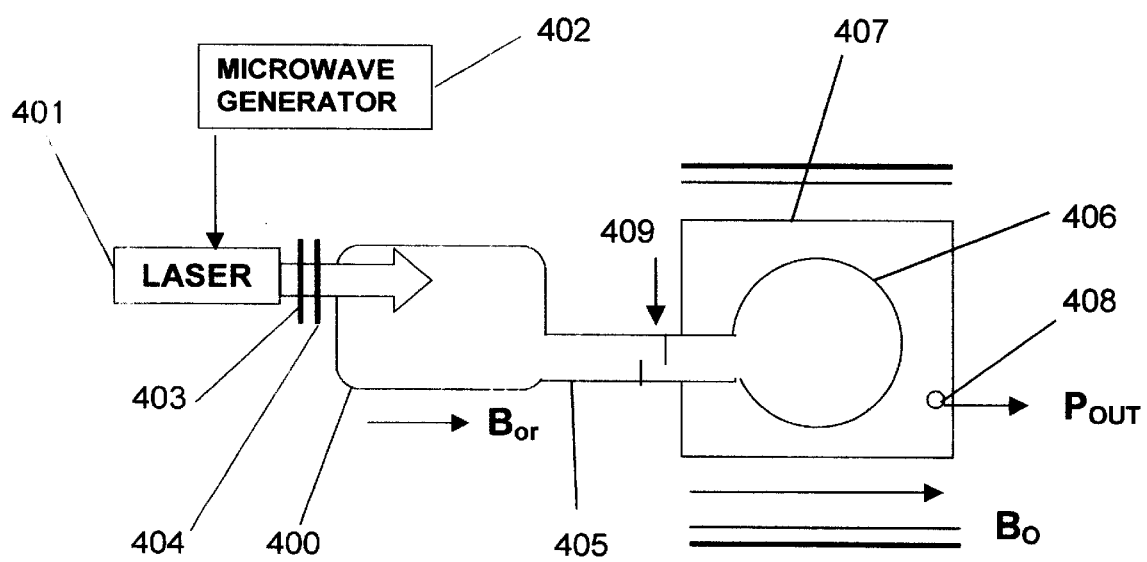
FIG. 4 is a schematic illustration of another embodiment of the atomic frequency standard of the invention similar to that of FIG. 3 but providing both inversion and coherent state preparation of the atomic ensemble by means of Coherent Population Trapping before the atoms enter the microwave cavity region.
Figure 4A:
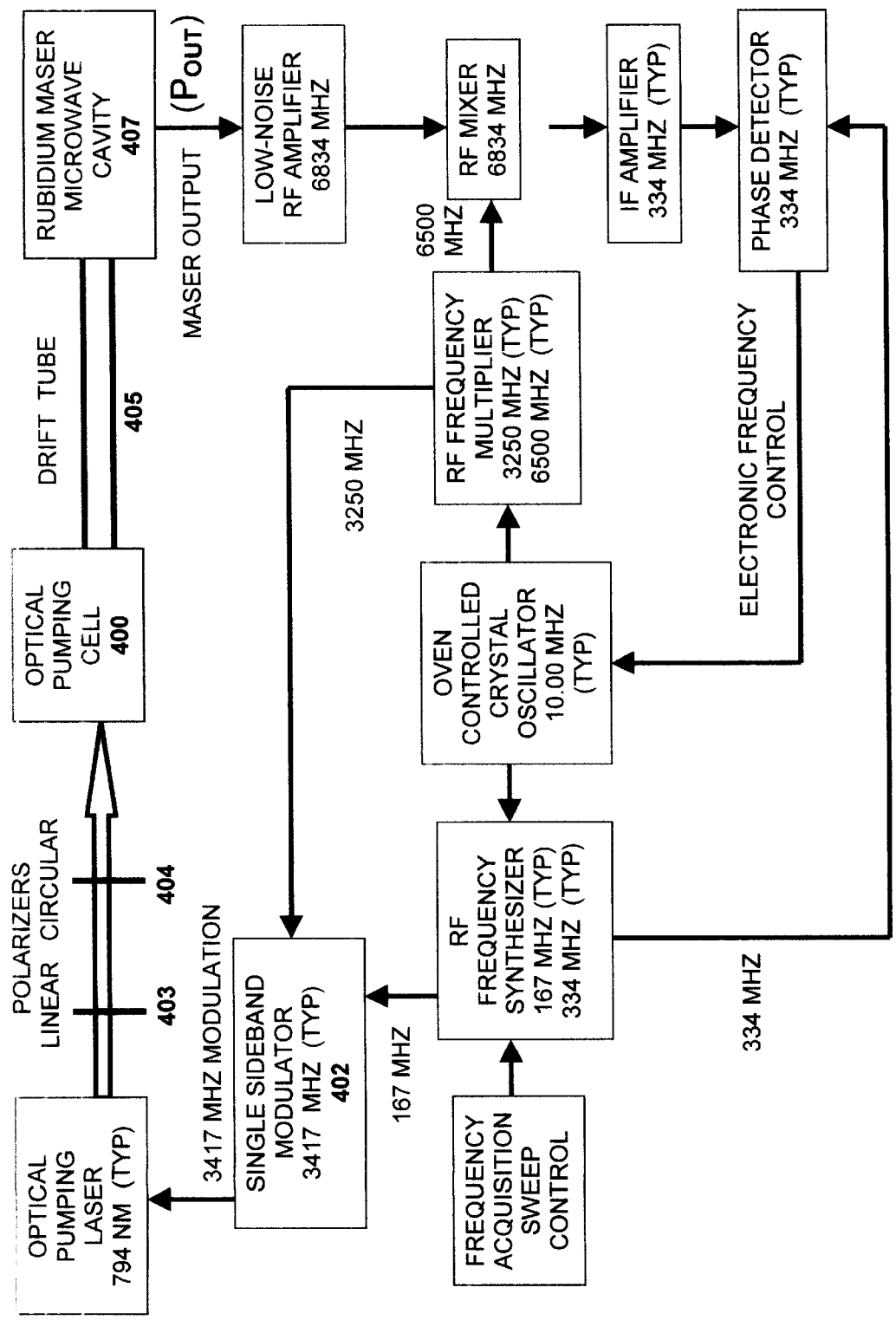
FIG. 4A is a schematic electronic block diagram for the frequency standard of FIG. 4, utilizing rubidium 87 as the exemplary atomic source material.
Figure 6:
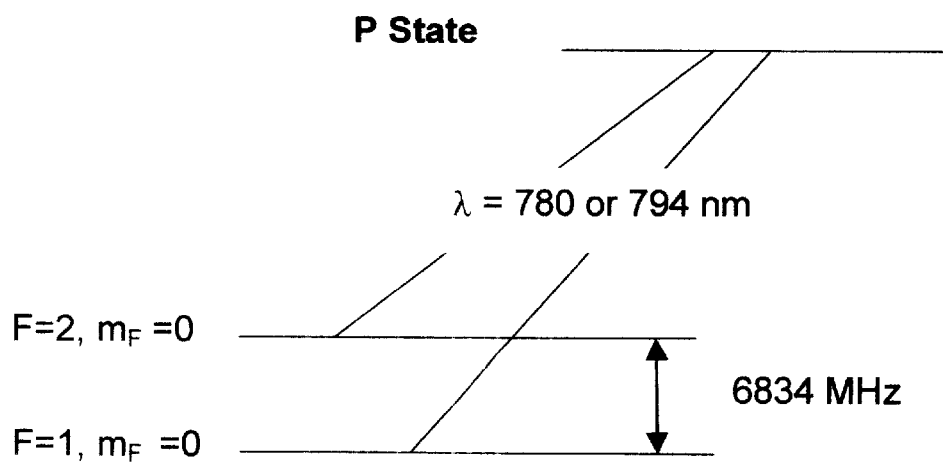
FIG. 6 is an illustration of the excitation scheme used in coherent state preparation of rubidium using the Coherent Population Trapping technique.

In the embodiment of FIGS. 4 and 4A, state coherence of the atomic source material is introduced directly in the pumping cell through the technique of Coherent Population Trapping. Referring in particular to FIG. 4, the system of this embodiment of the invention comprises an optical pumping cell 400 containing the rubidium 87 atomic source material. Optical pumping of the cell 400 is achieved by means of a laser 401 whose frequency is modulated by means of a microwave generator 402 and whose light emission is first linearly polarized and then circularly polarized by means of a linear polarizer 403 and circular polarizer 404, in series, preparatory to entry of the light into the pumping cell 400. The pumping cell 400 is connected by means of drift region 405 to a storage bulb 406 contained within maser microwave cavity 407. Within the drift region 405 is stationed a baffle means 409 which acts to prevent scattered light generated in pumping cell 400 from entering the storage cell 406. The maser microwave cavity 407 is tuned to the hyperfine resonance frequency of the atomic source material. As in the case of the previously described embodiments of the invention, the internal surfaces of the pumping cell 400, drift region 405 and storage bulb 406 are suitably coated with a material which mitigates against relaxation due to collisions of the source material atoms with their constraining surfaces. In this embodiment the pumping laser 401 is modulated at a sub-harmonic of the hyperfine frequency of the alkali atom chosen. Thus, for rubidium 87, this modulated frequency can be 3417 MHz. This creates two sidebands, separated by the hyperfine frequency of rubidium 87, which resonate with the two optical transitions corresponding to transitions from the two ground levels F=1 and F=2 of the $S_{1/2}$ state to the P state, as illustrated in FIG. 6. This is termed a lambda excitation scheme. Due to the coherence of the optical excitation which is produced by two coherent radiation fields (two sidebands of the same laser) interference takes place in the excitation process. This causes a phenomenon of population trapping in the ground state: no transitions take place to the P state and a strong coherence is created at the ground state hyperfine frequency. The rubidium 87 atoms are thus put into a coherent superposition of the two ground state hyperfine levels. They drift to the storage bulb 406 through the drift region 405, creating within bulb 406 a magnetization oscillating at the hyperfine frequency. As previously, this magnetization creates a field in the cavity 407 and excites a cavity mode. The field reacts back on the atoms, stimulating microwave emission in the atomic ensemble. The microwave signal, $P_{out}$, is coupled out of the cavity through the coupling loop 408. As an alternative to the use of a single laser 401, as shown, it is also possible to utilize as the optical pump two lasers separated in frequency by a value equal to the hyperfine frequency of the alkali metal atoms and phase-locked to each other.

In the embodiments of the invention illustrated in FIGS. 3, 3A, 4 and 4A sealed cells are employed. The embodiment of FIGS. 2, 2A is a beam device and thus operates under continuous evacuation through appropriate vacuum pumps.

In the case of the pre-stimulated hydrogen maser frequency standard of FIGS. 2, 2A, the power output is a function of the atomic flux. In the case of the laser excited alkali metal maser frequency standards of FIGS. 3, 3A, 4, and 4A, the power output is a function of the laser intensity up to a level whereat all atoms are excited into the desired state. Furthermore, the power output is also a function of the density of alkali metal atoms, controlled by the temperature of the enclosure. The power output of all three preferred depicted embodiments of the invention is also a function of the cavity quality factor Q.

The principal improvement realized by the present invention over prior art maser frequency standard technology resides in the absence of an oscillation threshold with respect to atomic flux, temperature or maser microwave cavity quality factor. This provides greater liberty in the design of a practical system, especially regarding the maser microwave cavity construction. In particular, modes other than those conventionally used in these masers, such as the TE011 mode in the case of the hydrogen maser or the TE021 mode in the case of the rubidium maser can be used. With the absence of threshold on cavity Q it becomes possible to load the cavity with a dielectric material, such as quartz, sapphire or PTFE, thus enabling a reduction in the size of the device. A further improvement over previous technology in respect of prior art optically pumped alkali metal maser frequency standards resides in the separation of the region where state preparation by optical pumping takes place from the region where the emission of the microwave radiation takes place. This avoids perturbation of the atomic ensemble within the maser microwave cavity by the optical radiation used to accomplish the state preparation. In the prior art optical pumping is conventionally accomplished in the same region as that where microwave emission takes place and this causes both line broadening and introduces a frequency shift, termed the "light shift". There is no light shift experienced in the practice of the present invention other than that caused by stray radiation reaching the part of the storage cell contained within the cavity. Although, in the embodiment of FIG. 3 the pumping cell 300 is shown to be placed in line on a symmetry axis with the storage bulb 303, the present invention envisions also the possibility of placing the said pumping region 300 offset from the symmetry axis in order to avoid fluorescent light to diffuse into the storage bulb 306 and to cause a light shift. Other methods and structures to prevent fluorescent shift to diffuse in the cavity such as baffles in the light path are also envisioned as illustrated in FIG. 4. Moreover, in the practice of the present invention the phenomenon of cavity pulling, which plagues active masers in first order (the ratio of the cavity quality factor to the atomic line quality factor) is reduced primarily to a second order effect in the ratio of the same quality factors. While the foregoing description demonstrates certain preferred embodiments of the present invention and of techniques for the implementation and use thereof, it should be noted and understood that said description is not to be construed as limiting in nature because many obvious changes, modifications and variations may be made therein without departing from the essential scope, spirit or intention of the invention. For instance, while the embodiment of the invention of FIGS. 3, 3A, using rubidium 87 as the atomic source material, has been described as employing a laser as the optical pump, where said pumping step is separate and apart from the pre-stimulation step of the invention, said pumping step can also be served by irradiating the rubidium 87 source material with the light of a properly filtered rubidium spectral lamp.

What is claimed is:

1. In a method for generating an atomic frequency standard signal which comprises:

(A) providing an atomic source material;

(B) inverting the population of the ground state hyperfine energy levels of said source materials;

(C) introducing said inverted population source material into a storage bulb situated inside a microwave cavity tuned to the ground state hyperfine resonance frequency of said atomic source material and wherein said atomic source material emits sufficient quanta of energy to result in a self-sustained microwave signal generated within said cavity by "microwave amplification by stimulated emission of radiation", the improvement which comprises pre-stimulating said atomic source material into a coherent superposition of its two ground state hyperfine energy levels preparatory to introducing same into said storage bulb.

2. The improvement of claim 1 wherein the inversion of population prior to pre-stimulation is achieved by subjecting the atomic source material to optical pumping.

3. The improvement of claim 1 wherein the inversion of population prior to pre-stimulation is achieved by spatially selecting only those atoms in the upper energy levels of the ground state.

4. The improvement of claim 1 wherein said pre-stimulating is achieved by subjecting the atomic source material to microwave radiation at the hyperfine resonance frequency thereof.

5. The improvement of claim 2 wherein said optical pumping is achieved by irradiation of the atomic source material with laser means.

6. The improvement of claim 5 wherein said laser means used to invert the population of ground state hyperfine energy levels also to pre-stimulate said atomic source material and is a single laser modulated at a sub-harmonic of the ground state hyperfine frequency of the atomic source material, thereby creating two sidebands resonating with the two optical transitions from the ground state hyperfine levels of the atomic source material and whereby Coherent Population Trapping takes place wherein the atomic source material is placed in a coherent superposition of its two ground state hyperfine levels.

7. The improvement of claim 5 wherein said laser means used to invert the population of ground state hyperfine energy levels and to pre-stimulate said atomic source material comprises two lasers operated at frequencies which differ by a value equal to the hyperfine frequency of the atomic source material and which lasers are phase-locked to each other, whereby Coherent Population Trapping takes place wherein the atomic source material is placed in a coherent superposition of its two ground state hyperfine levels.

8. The improvement of claim 3 wherein said atomic source material is hydrogen.

9. The improvement of claim 4 wherein said atomic source material is hydrogen.

10. The improvement of claim 2 wherein said atomic source material is an alkali metal.

11. The improvement of claim 10 wherein said alkali metal is rubidium.

12. An atomic frequency standard comprising means to excite an atomic source material, the atoms of said material being hydrogen and alkali metals means to pre-stimulate said source material at the hyperfine frequency of the ground state thereof into a coherent superposition of its two ground state energy levels; means to conduct said pre-stimulated atoms into a storage bulb, said storage bulb being contained within a maser microwave cavity tuned to the resonance hyperfine frequency of said atomic source material, said maser microwave cavity further comprising a signal-receiving loop.

13. The frequency standard of claim 12 wherein said atomic source material is molecular hydrogen and said standard further includes dissociator means to dissociate molecular hydrogen into an atomic hydrogen beam having an axis co-aligned with the entrance to said storage bulb and means to conduct said atomic hydrogen beam from said dissociator means through said pre-stimulation means.

14. The frequency standard of claim 13 wherein said dissociator means is an electromagnetic discharge cell.

15. The frequency standard of claim 13 including state selector means interposed between said dissociator means and said pre-stimulation means, said state selector means being adapted to concentrate hydrogen atoms in the energy states $F=1$, $m_F=1$ and $F=1$, $m_F=0$ along said beam axis, thereby to cause inversion of the population of ground state hyperfine energy levels of the atoms along said axis by spatial selection.

16. The frequency standard of claim 15 wherein said state selector means is a hexapole magnet.

17. The frequency standard of claim 13 wherein said pre-stimulation means is a microwave cavity creating therewithin a microwave field at the hyperfine frequency of said hydrogen atoms.

18. The frequency standard of claim 12 wherein said pre-stimulation means is a microwave cavity creating therewithin a microwave field at the hyperfine frequency of said atomic source material and wherein said microwave cavity is equipped with waveguides at below the cut-off frequency, thereby to contain the microwave radiation therewithin.

19. The frequency standard of claim 12 wherein the interior surface of said storage bulb is coated with a substance which is non-reactive with the atomic source material atoms.

20. The frequency standard of claim 19 wherein said substance mitigates against relaxation of said atomic source material atoms upon collisions thereof with said interior surface.

21. The frequency standard of claim 20 wherein said atomic source material is hydrogen and said substance is polytetrafluoroethylene.

22. The frequency standard of claim 20 wherein said atomic source material is an alkali metal and said substance is a long chain wax.

23. The frequency standard of claim 12 wherein said maser microwave cavity contains a filler composed of a low microwave loss dielectric material.

24. The frequency standard of claim 12 wherein said atomic source material is an ensemble of alkali metal atoms and further including excitation means comprising an intensity optical pumping cell containing said alkali metal atoms, said pumping cell including a light source for irradiating the alkali metal atoms contained therein, wherein said alkali metal atoms are intensity optically pumped by irradiation with light, said optical pumping cell being in open communication with said pre-stimulation means.

25. The frequency standard of claim 24 wherein said light source is a laser.

26. The frequency standard of claim 25 wherein the radiation intensity of said laser is sufficient to produce an inversion of population of the ground state energy levels of said alkali metal atoms.

27. The frequency standard of claim 24 wherein said pre-stimulation means is a microwave cavity driven by an external source having a frequency equal to the hyperfine frequency creating therewithin a microwave field at the hyperfine frequency of said alkali metal atoms.

28. The frequency standard of claim 26 wherein said pre-stimulation means is a microwave cavity driven by an external source having a frequency equal to the hyperfine frequency creating therewithin a microwave field at the hyperfine frequency of said alkali metal atoms.

29. The frequency standard of claim 24 wherein said excitation means and said pre-stimulation means are a single structure comprising said optical pumping cell containing an ensemble of alkali metal atoms, said light source being a single laser to irradiate said alkali metal atoms, said laser being modulated at a frequency which is a subharmonic of the hyperfine frequency of said alkali metal atoms, thereby creating two sidebands resonating with the two optical transitions corresponding to transitions from the two ground state levels of said alkali metal atoms and whereby Coherent Population Trapping takes place wherein the alkali metal atoms are placed in coherent superposition of their two ground state hyperfine levels.

30. The frequency standard of claim 24 wherein said excitation means and said pre-stimulation means are a single structure comprising said optical pumping cell containing a population of alkali metal atoms, said light source being two phase-locked lasers to irradiate said alkali metal atoms, said lasers being modulated at frequencies which differ from one another by a value equal to the hyperfine frequency of said alkali metal atoms, whereby Coherent Population Trapping takes place wherein the alkali metal atoms are placed in coherent superposition of their two ground state hyperfine levels.

31. The frequency standard of claim 24 wherein said means to conduct said pre-stimulated atoms into said storage bulb includes light barrier means to prevent scattered light generated in said pumping cell from entering said storage bulb.

* * * * *